US008290759B1

(12) United States Patent
Mu et al.

(10) Patent No.: US 8,290,759 B1
(45) Date of Patent: Oct. 16, 2012

(54) NEGATIVE BIAS TEMPERATURE INSTABILITY IN DYNAMIC OPERATION OF AN INTEGRATED CIRCUIT

(75) Inventors: Fuchen Mu, Austin, TX (US); Lifeng Wu, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 909 days.

(21) Appl. No.: 12/061,531

(22) Filed: Apr. 2, 2008

(51) Int. Cl.
*G06F 7/60* (2006.01)
*G06F 17/50* (2006.01)
(52) U.S. Cl. .................................. 703/14; 703/2; 703/13
(58) Field of Classification Search ................. 703/2, 13, 703/14
See application file for complete search history.

(56) References Cited

U.S. PATENT DOCUMENTS 6,278,964 B1     8/2001     Fang et al.

OTHER PUBLICATIONS

Sanjay V. Kumar et al., "An Analytical Model for Negative Bias Temperature Instability", 2006, ACM, pp. 493-496.*
Cadence Design Systems Inc., "Reliability Simulation in Integrated Circuit Design", 2003, Cadence Design Systems Inc., pp. 1-11.*
V. Huard et al., "NBTI degradation: From physical mechanisms to modelling", 2005, Elsevier Ltd., pp. 1-23.*
Dieter K. Schroder et al., "Negative bias temperature instability: Road to cross in deep submicron silicon semiconductor manufacturing", 2003, American Institute of Physics, pp. 1-18.*
H. Usui, M. Kanno, and T. Morikawa, "Time and Voltage Dependence of Degradation and Recovery under Pulsed Negative Bias Temperature Stress," IRPS 2003.
S. Rangan, N. Mielke, and E. C.C Yeh, "Universal Recovery Behavior of Negative Bias Temperature Instability," pp. 341-344, IEDM 2003.
B. Zhu, J. S. Suehle, and J. B. Bernstein, "Mechanism for Reduced NBTI Effect under Pulsed Bias Stress Conditions," IRPS 2004.
W. Abadeer and W. Ellis, "Behavior of NBTI under AC Dynamic Circuit Conditions," pp. 17-22, IRPS 2003.
K. S. Kundert, The Designer's Guide to SPICE and SPECTRE®, Kluwer Academic Publishers. 1995. (Title page, copyright page, table of contents and chapter 1 submitted).
Z. Liu, W. Zhang, and F. Mu, "Build-in reliability analysis for circuit design in the nanometer technology era," ICICDT '04 (International Conference on Integrated Circuit Design and Technology, 2004).

\* cited by examiner

*Primary Examiner* — Kandasamy Thangavelu
*Assistant Examiner* — Nithya Janakiraman
(74) *Attorney, Agent, or Firm* — Schwegman Lundberg & Woessner, P.A.

(57) ABSTRACT

A method of determining a Negative Bias Temperature Instability (NBTI) effect that combines degradation and recovery for dynamic operation of an integrated circuit (IC) includes: specifying one or more parameters for a degradation model for the IC during a stressed portion of a voltage cycle; specifying one or more parameters for a recovery model for the IC during an unstressed portion of the voltage cycle; determining a degradation value for the voltage cycle from the degradation model; determining a recovery value for the voltage cycle from the recovery model; determining an NBTI value that combines the degradation value and the recovery value for the voltage cycle; and saving at least one value for the NBTI value.

22 Claims, 16 Drawing Sheets

US 8,290,759 B1

NEGATIVE BIAS TEMPERATURE INSTABILITY IN DYNAMIC OPERATION OF AN INTEGRATED CIRCUIT

BACKGROUND OF THE INVENTION

1. Field of Invention

The present invention relates to integrated circuits (ICs) generally and more particularly to determining effects related to negative bias temperature instability (NBTI) for dynamic operation of an integrated circuit.

2. Description of Related Art

For ICs with PMOS structures (e.g., a p-channel MOSFET (metal-oxide-semiconductor field-effect transistor)), NBTI has been recognized as a critical limitation for technology scaling in deep sub-micron devices [1] [2] [3] [4]. In general, NBTI degrades PMOS devices by shifting threshold voltages and reducing drive currents, thus raising an important concern for analog and digital circuits.

Although the operational setting is typically dynamic or AC (Alternating Current), at least some conventional modeling relies on static or DC (Direct Current) analysis. However, recent dynamic NBTI tests have indicated that in some cases the interface states generated during the on-state of these transistors are partially annealed during the off-state. Consequently, the predictions based on the static NBTI tests, where the transistor is always on, may be too pessimistic. Therefore, it is critically important to take into account the NBTI recovery effect in NBTI reliability modeling and reliability simulation.

Thus, there is a need for improved determination of NBTI effects for dynamic operation of an IC.

SUMMARY OF THE INVENTION

In one embodiment of the present invention, a method of determining a Negative Bias Temperature Instability (NBTI) effect that combines degradation and recovery for dynamic operation of an integrated circuit (IC) includes: specifying one or more parameters for a degradation model for the IC during a stressed portion of a voltage cycle; specifying one or more parameters for a recovery model for the IC during an unstressed portion of the voltage cycle; determining a degradation value for the voltage cycle from the degradation model; determining a recovery value for the voltage cycle from the recovery model; determining an NBTI value that combines the degradation value and the recovery value for the voltage cycle; and saving at least one value for the NBTI value (e.g., saving the NBTI value itself or some related characterization).

According to one aspect of this embodiment, specifying the one or more degradation model parameters may include extracting the one or more degradation model parameters from measurements for the IC under stressed conditions for a range of voltage bias values, a range of temperature values, and a range of IC geometric values (e.g., channel lengths).

According to another aspect, specifying the one or more recovery model parameters may include extracting the one or more recovery model parameters from measurements for the IC under stressed conditions for a range of voltage bias values, a range of temperature values, and a range of IC geometric values (e.g., channel lengths).

According to another aspect, determining the degradation value may include calculating the degradation value from a time value for the stressed portion of the voltage cycle (e.g., from a time-power formula for the degradation value).

According to another aspect, determining the recovery value may include calculating the recovery value from a time value for the unstressed portion of the voltage cycle (e.g., from a time-log formula for the recovery value).

According to another aspect, determining the NBTI value may include adding together the degradation value and the recovery value to calculate the NBTI effect for the voltage cycle.

According to another aspect, the NBTI value may characterize a variation in drain current for the IC.

According to another aspect, the stressed portion of the voltage cycle may characterize a voltage bias between two terminals of the IC (e.g., between a gate and a source of the IC).

According to another aspect, calculations may be carried out over multiple cycles so that the method includes determining multiple degradation values from the degradation model; determining multiple recovery values from the recovery model; and determining a multi-cycle NBTI value by combining the degradation values and the recovery values over multiple voltage cycles.

According to another aspect, the method may further include specifying a netlist for the IC; aging the netlist based on the NBTI value (e.g., modifying the netlist to incorporate NBTI effects); and simulating the aged netlist for calculating NBTI effects in the IC (e.g., by comparison with a simulation of the original netlist).

Additional embodiments relate to an apparatus for carrying out any one of the above-described methods, where the apparatus includes a computer for executing instructions related to the method. For example, the computer may include a processor with memory for executing at least some of the instructions. Additionally or alternatively the computer may include circuitry or other specialized hardware for executing at least some of the instructions. Additional embodiments also relate to a computer-readable medium that stores (e.g., tangibly embodies) a computer program for carrying out any one of the above-described methods with a computer. In these ways the present invention enables improved determination of NBTI effects for dynamic operation of an IC

DETAILED DESCRIPTION OF EXEMPLARY EMBODIMENTS

1. Determining NBTI Effects

Figure 1:
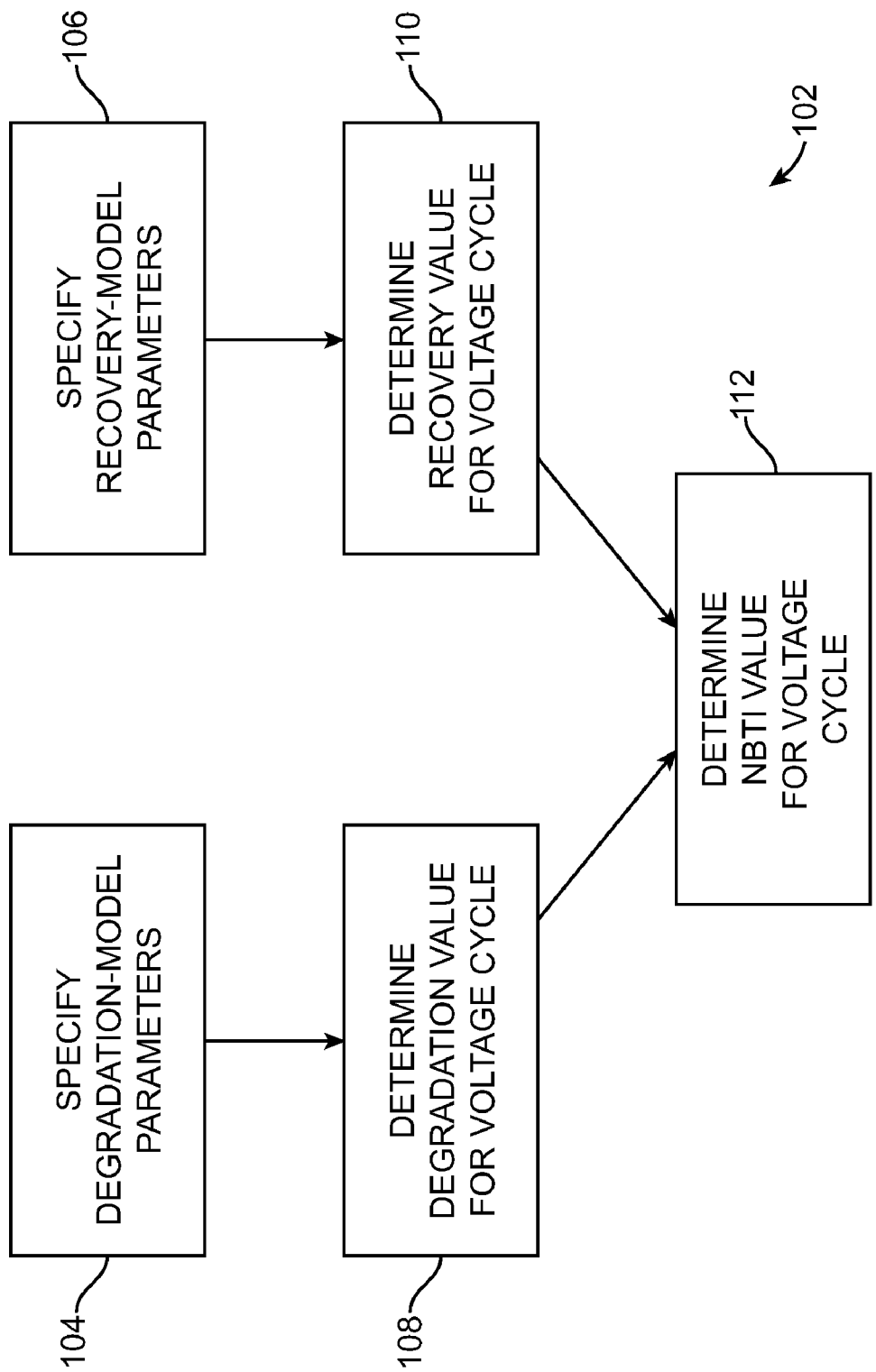
FIG. 1 shows an exemplary method for determining an NBTI effect according to an embodiment of the present invention.

An embodiment of the present invention is shown in FIG. 1. A method 102 of determining a Negative Bias Temperature Instability (NBTI) effect that combines degradation and recovery for dynamic operation of an integrated circuit (IC) includes specifying parameters for a degradation model 104 and specifying parameters for a recovery model 106. As discussed below in greater detail, the degradation model characterizes circuit properties (e.g., drain current) during a stressed portion of a voltage cycle (e.g., an AC (Alternating Current) cycle) and the recovery model characterizes the circuit property during an unstressed portion of the voltage cycle. The method 102 further includes determining a degradation value for the voltage cycle from the degradation model 108 and determining a recovery value for the voltage cycle from the recovery model 110. These values can then be combined (e.g., added together) to give an NBTI value that captures the overall effect for the voltage cycle 112. The method 102 can be applied to a single cycle or a range that covers multiple cycles.

At least some values based on the results of the method 102 can be output to a user or saved for subsequent use. For example the NBTI value can be saved directly for application as in IC modeling. Alternatively, some derivative or summary form of the results (e.g., separate values for degradation and recovery portions, multi-cycle averages, interpolations, etc.) can be saved for later use according to the requirements of the operational setting.

Figure 2:
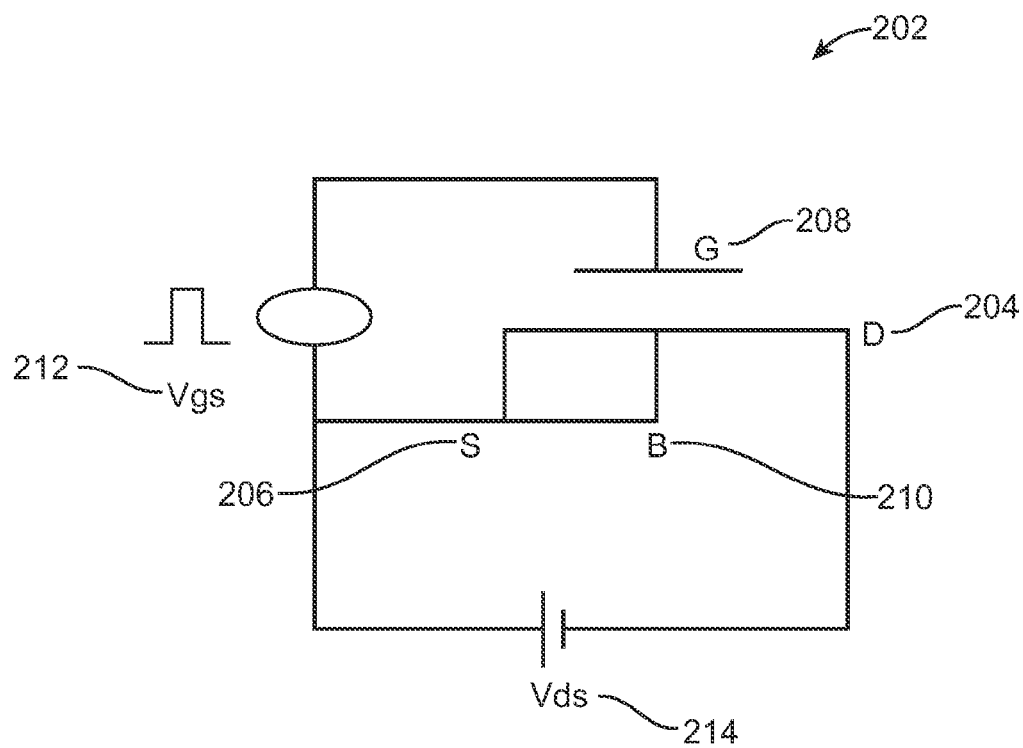
FIG. 2 shows an exemplary circuit for the embodiment shown in FIG. 1.

The method 102 can be applied generally, for example, to PMOS devices. FIG. 2 shows a circuit 202 with a drain 204, source 206, gate 208, and base (e.g., substrate) 210. A voltage Vgs is applied between the gate and the source 212. And a voltage Vds is applied between the drain and the source 214. Although the dimensions are arbitrary, nominal values include a gate oxide thickness of about 6.8 nm, a channel width of about 2.5 μm, and a gate channel length ranging from about 0.33 μm to 0.5 μm.

Figure 3:
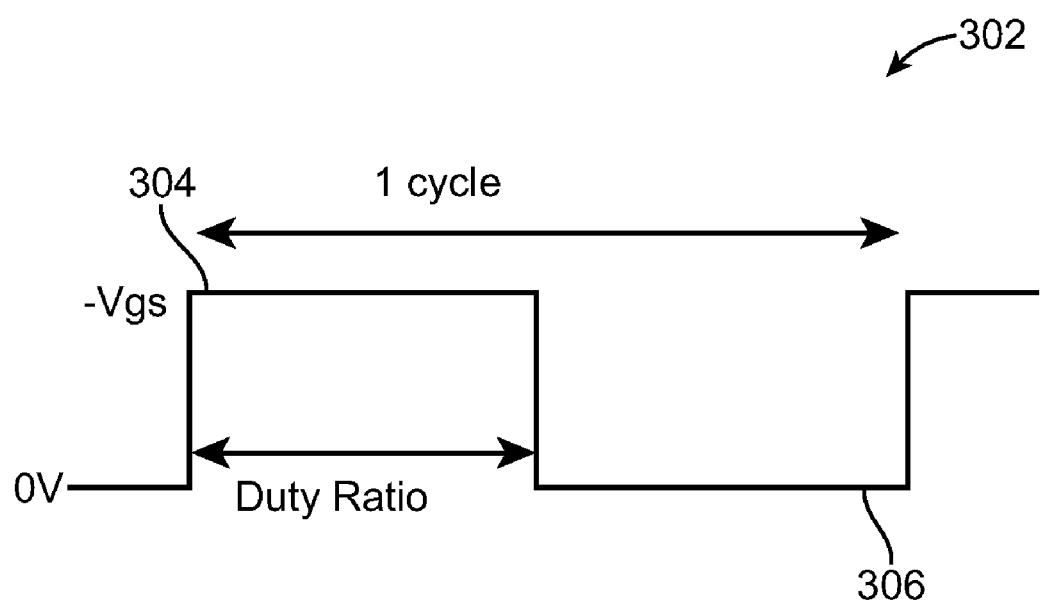
FIG. 3 shows an exemplary timing chart for the circuit shown in FIG. 2.

FIG. 3 shows a diagram for an NBTI recovery measurement and timing chart 302. For this embodiment, the temperature was kept constant during NBTI stress, recovery, and device characteristics measurement stages. A pulse waveform between—Vgs and 0V was applied to the gate. The period of the cycle, including a stressed portion 304 and an unstressed portion 306, may vary according to the operational setting. For example, in some laboratory settings a cycle of 200 sec. may be used; however in simulation much smaller cycles (e.g, 1 micro-sec.) may be used. The duty ratio (e.g., fraction of cycle that is stressed 304) is 0.5 in the FIG. 3, but other variations are also possible.

Figure 4:
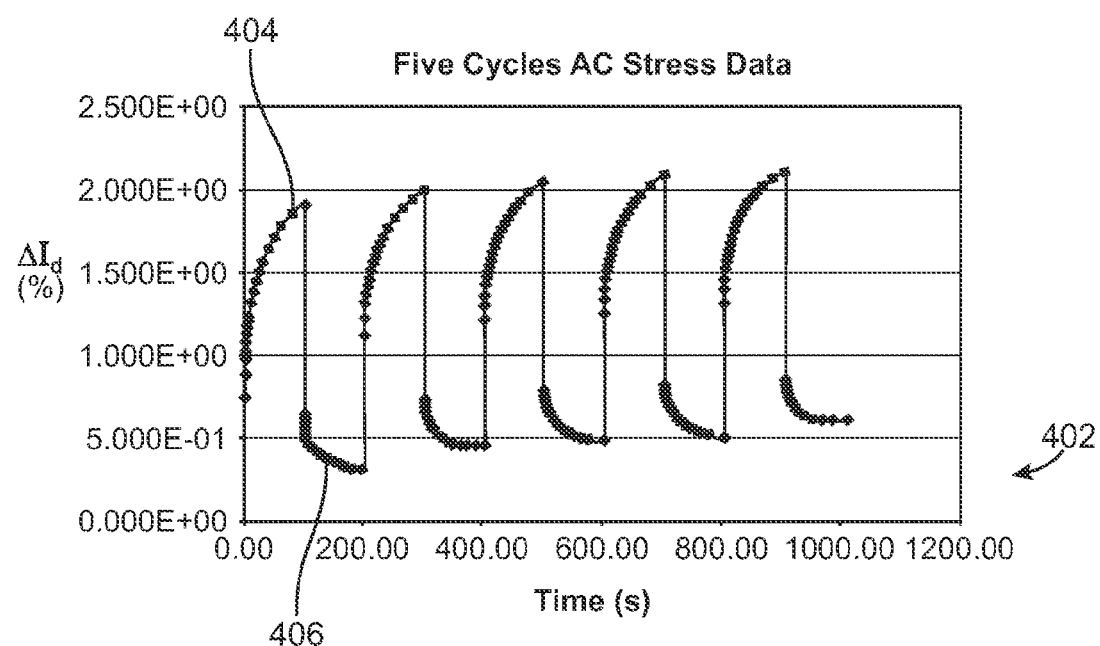
FIG. 4 shows an exemplary waveform for a circuit.

FIG. 4 shows a typical waveform 402 under dynamic NBTI stress. The waveform includes a stressed portion 404 and an unstressed portion 406 for each cycle. For this case, channel width W=2.5 μm, channel length L=0.5 μm, channel thickness Tox=6.8 nm, temperature T=125° C.; Vgs (stress)=−5.2V, Vgs (measurement)=−3.3V, Vgs (recovery)=0V, Vds (measurement)=−0.1V, Vbs (stress, recovery, measurement) =0V; stress time=100 sec per cycle, recovery time=100 sec per cycle, and cycle period=200 sec. In FIG. 4, the horizontal axis shows the time (sec) and the vertical axis shows the change in drain current (Id) as a percentage of the nominal value at Time=0 sec.

Figure 5A:
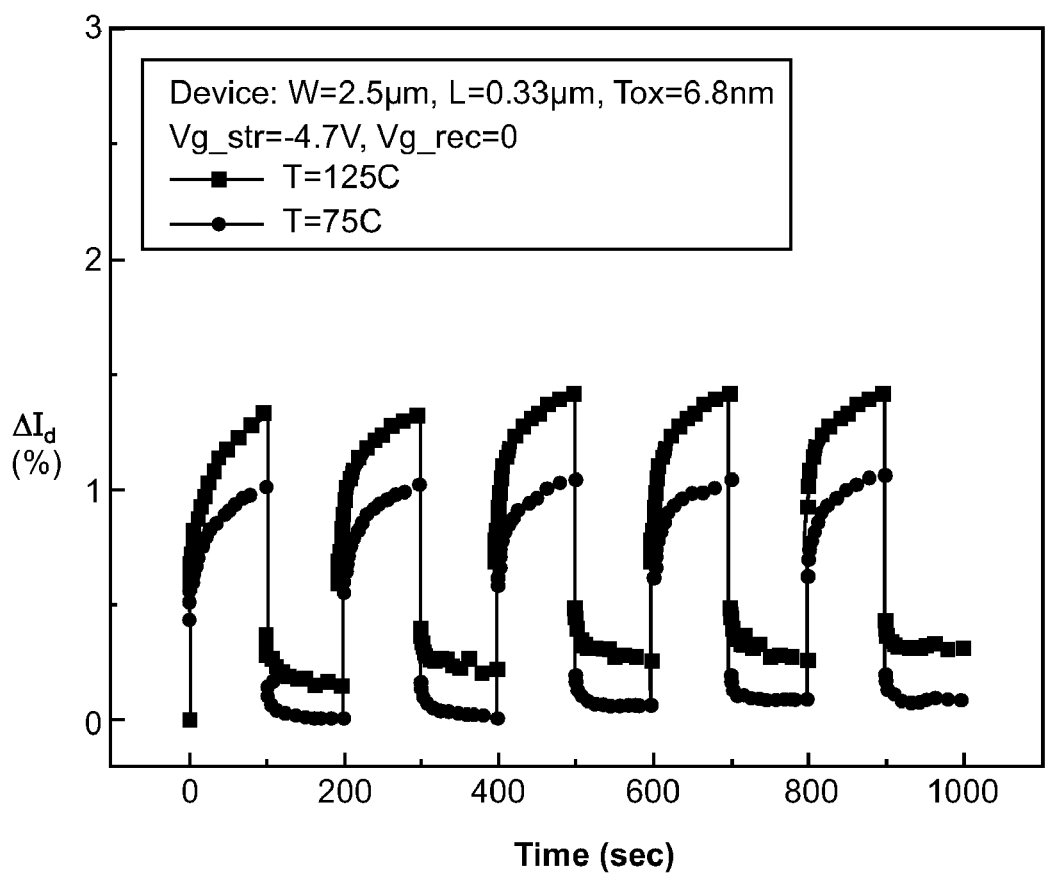
FIGS. 5A, 5B, and 5C show exemplary waveform variations for a circuit.
Figure 5B:
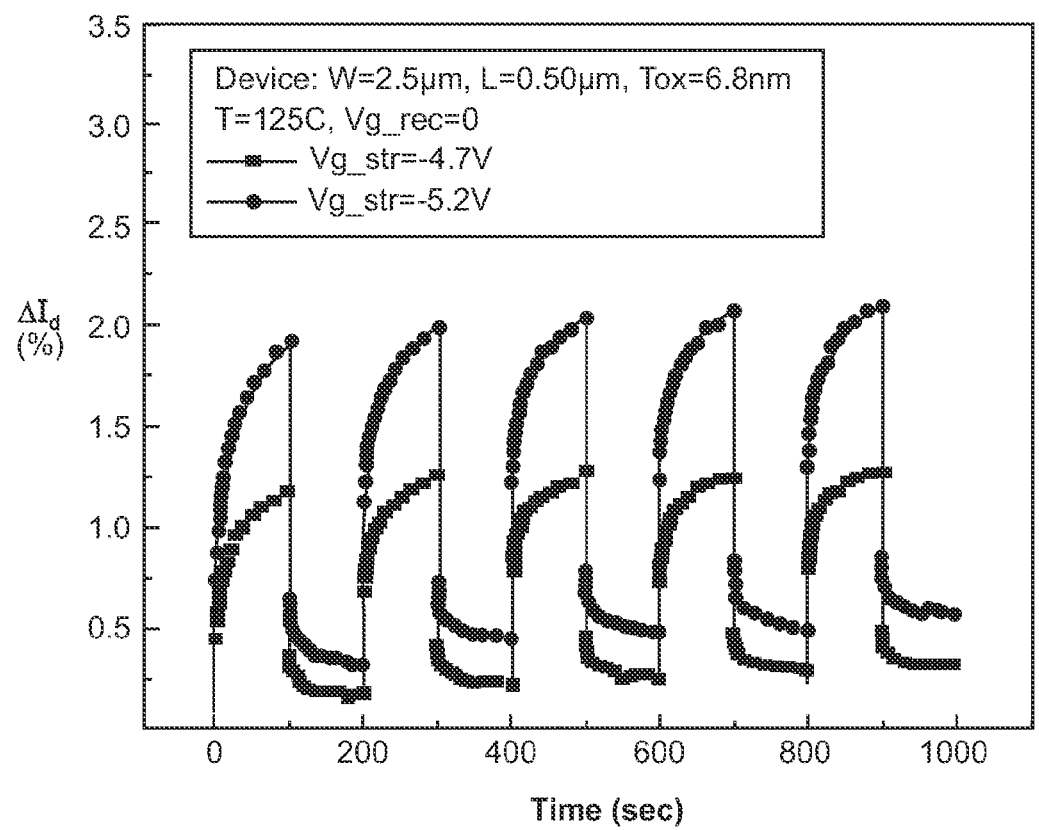
Figure 5C:
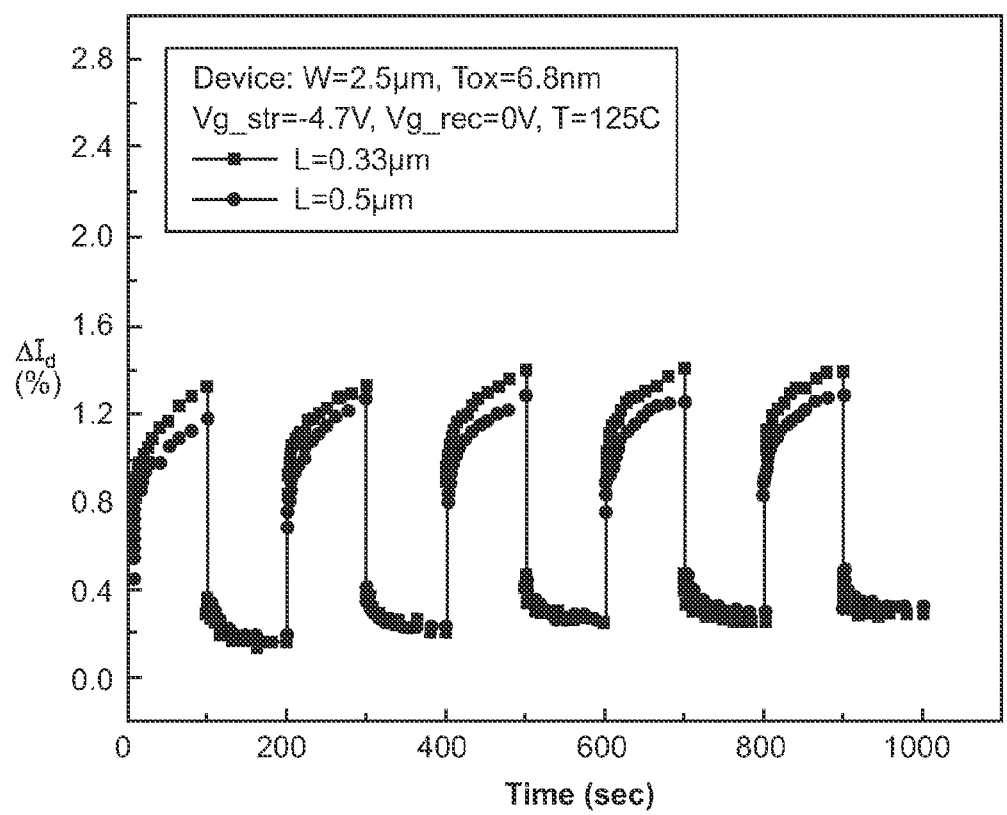

Variations in system parameters can result in performance variations as illustrated in FIGS. 5A-5C. FIG. 5A shows variations in drain current (as a percentage from the nominal value) for different temperatures T. FIG. 5B shows variations in drain current for different stress voltages Vgs. FIG. 5C shows variations in drain current for different channel lengths L. Similarly as in FIG. 4, these waveforms include stressed and unstressed portions corresponding to degradation and recovery for the IC.

As shown in FIG. 5A, a higher temperature typically leads to greater degradation. As shown in FIG. 5B, a higher stress voltage typically leads to greater degradation. As shown in FIG. 5C, a narrower channel length typically leads to greater degradation. As discussed below, embodiments of the present invention are able to capture these sensitivities in modeling NBTI effects.

2. NBTI Models

According to an embodiment of the present invention, changes in the drain current over a voltage cycle can be represented as a combination of the degradation effect during a stressed portion of the cycle 404 and the recovery effect during an unstressed portion of the cycle 406.

Figure 6:
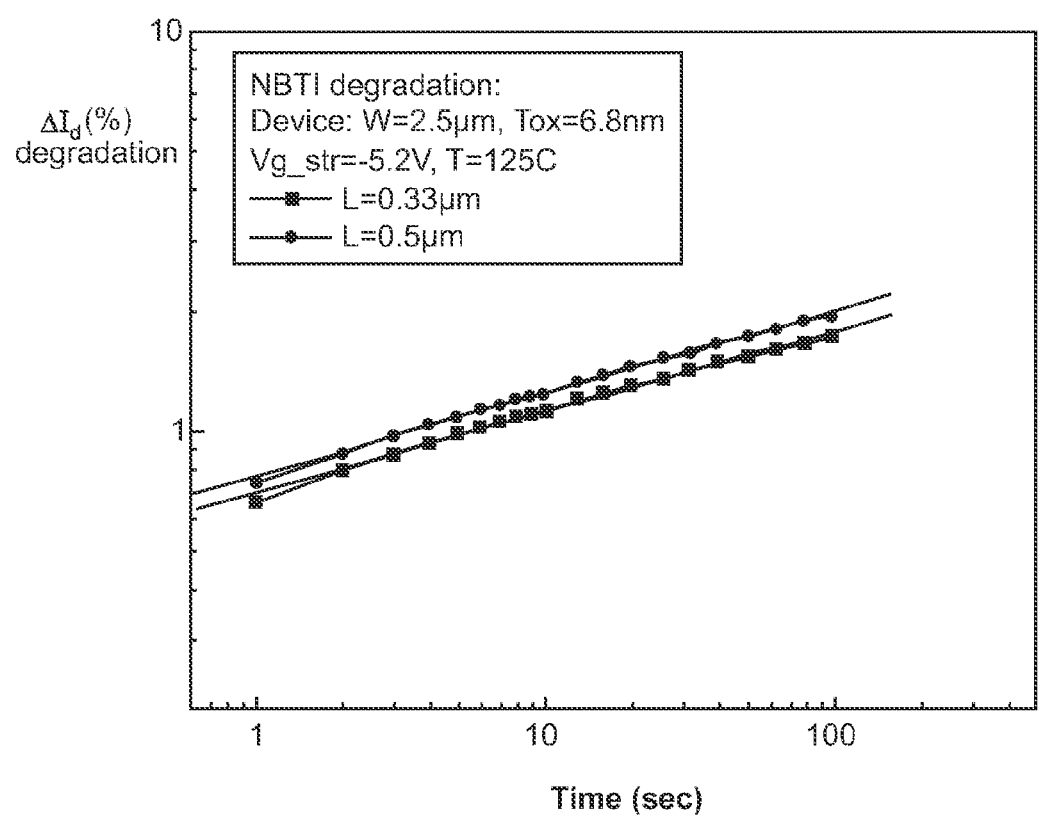
FIG. 6 shows exemplary waveforms for the stressed portion of a voltage cycle of a circuit.

FIG. 6 shows characteristic data for the stressed portion of a cycle on a log-log scale. A corresponding NBTI degradation model follows a time-power law with the same power n for different channel lengths:

$$\Delta D = A_D \exp\left(\frac{-E_a}{kT}\right) \exp\left(\frac{\gamma}{V_g}\right) t^n. \tag{1}$$

In Eq. (1) $A_D$ is a fitting parameter, $E_a$ is activation energy, T is temperature, $\gamma$ is voltage acceleration factor, $V_g$ is gate voltage, t is stressing time, n is the time-power law index.

Figure 7:
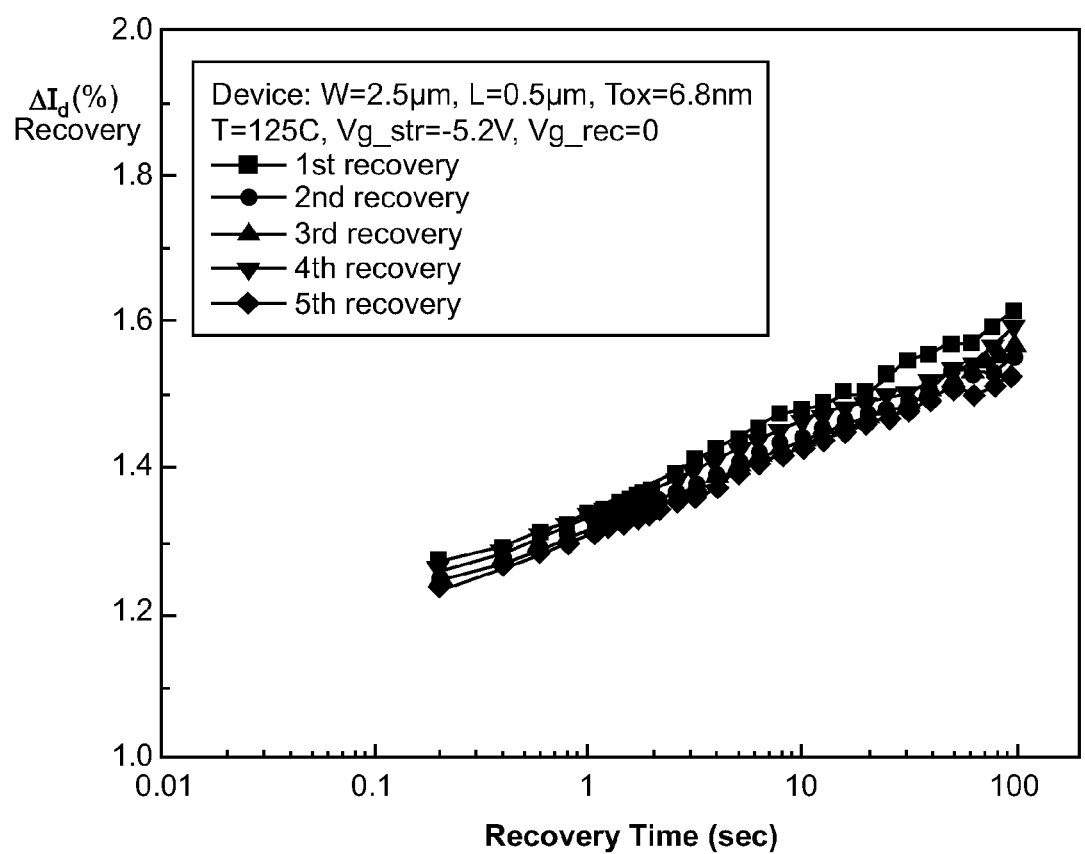
FIG. 7 shows exemplary waveforms for the unstressed portion of a voltage cycle of a circuit.

FIG. 7 shows characteristic data for the unstressed portion of a cycle on a log-linear scale for five recovery events that follow a time-log law for NBTI recovery:

$$\Delta R = A_R(L, V_{geff}, T) + B_R(L, V_{geff}, T)\log(t) \tag{2}$$

where, $$A_R = \exp\left(\frac{qE_{aA}}{kT}\right)(A_{Ag} + B_{Ag}V_{geff})A_l \tag{3}$$

$$B_R = \exp\left(\frac{qE_{aB}}{kT}\right)(A_{Bg} + B_{Bg}V_{geff})B_l. \tag{4}$$

In the above formulas, q is the electronic charge; $E_{aA}$ and $E_{aB}$ are activation energies for $A_R$ and $B_R$, respectively; $A_{Ag}$, $A_{Bg}$, $B_{Ag}$, and $B_{Bg}$ are fitting parameters; $V_{geff}$ is the effective gate voltage; $A_l$ and $B_l$ are parameters for channel length dependency.

There are two cases for $V_{geff}$ determination:

$$\text{Case1}: |V_{ds}| \leq |V_{ds\_th}| \; V_{geff} = V_{gs} \tag{5}$$

$$\text{Case2}: |V_{ds}| > |V_{ds\_th}| \; V_{geff} = V_{gs} + n_{V_{geff}} \times (|V_{ds}| - |V_{ds\_th}|) \tag{6}$$

where $n\_V_{geff}(\geq 0)$ is a fitting parameter, and $V_{ds\_th}(\leq 0)$ is a threshold for $V_{ds}$ dependency.

Taking into account both degradation (Eq. (1)) and recovery (Eq. (2)) effects, the final (or combined) NBTI degradation is:

$$\Delta_{TOTAL} = \Delta D(t_D) - \Delta R(t_R). \tag{7}$$

where the subscripts in the time-value arguments for ΔD and ΔR are used to indicate that Eqs. (1) and (2) are respectively evaluated for the relevant portions of the voltage cycle for degradation and recovery.

3. Simulation Results

Thus, for an embodiment of the present invention, parameters can be specified for the degradation model given by Eq. (1) 104 and the recovery model given by Eq. (2) 106. These parameters can be specified 104, 106 by sampling from given parametric ranges or by monitoring circuit behavior over a number of cycles and fitting the corresponding data to the corresponding functional forms (e.g., Eqs. (1)-(2)). Exemplary details related to parameter fitting are discussed below.

Given values for the relevant parameters, one can determine degradation values 108 by evaluating the degradation model (e.g., Eq. (1)), and one can determine recovery values 110 by evaluating the degradation model (e.g., Eq (2)). Then, in accordance with Eq. (7) these values can be combined to give an overall effective degradation for the voltage cycle 112.

Figure 8:
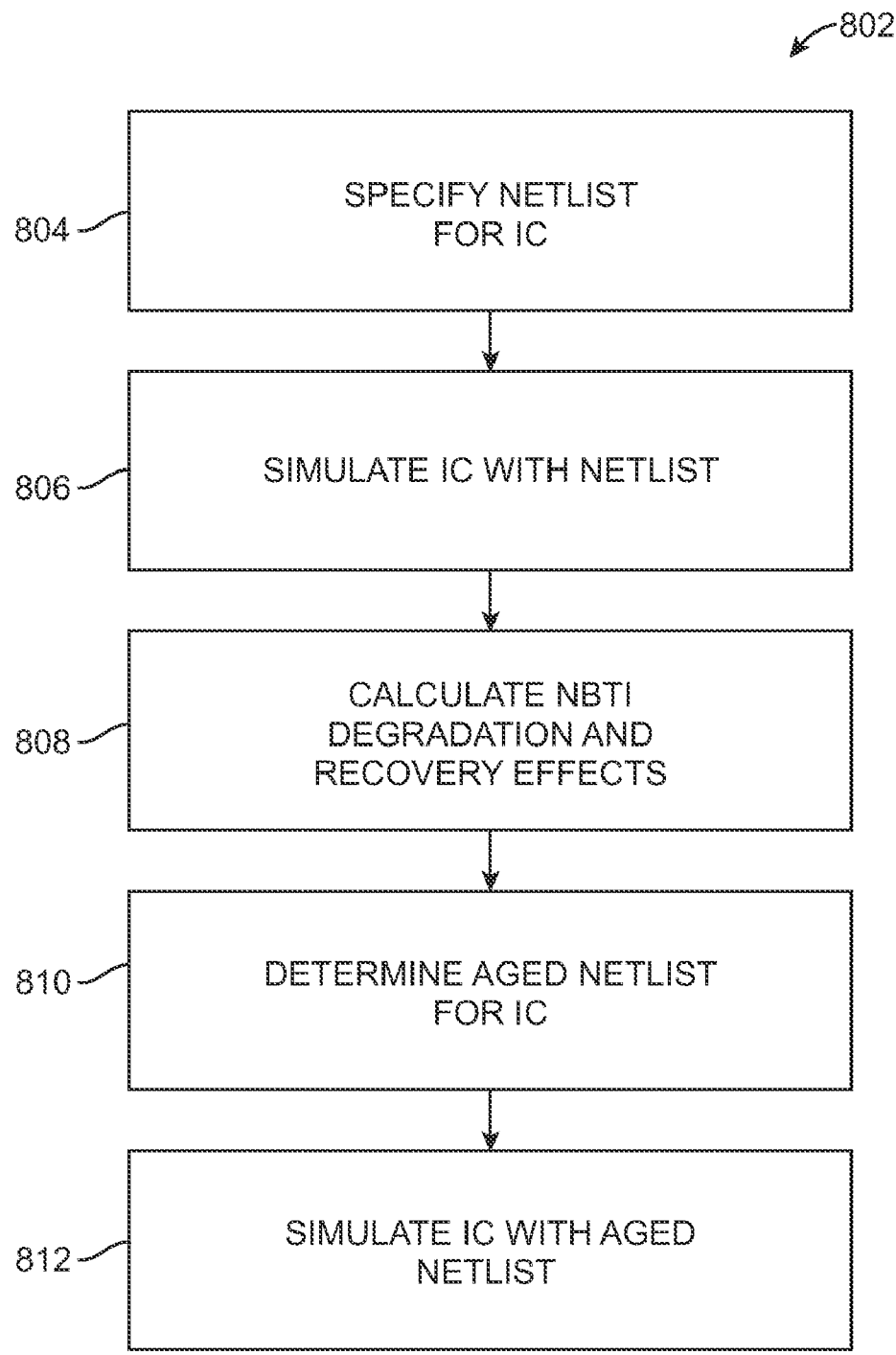
FIG. 8 shows an exemplary method for incorporating NBTI effects into SPICE simulations according to an embodiment of the present invention.

The results of the method 101 can be combined with analysis tools including SPICE [5]. For example, FIG. 8 shows a method 802 according to the present invention for incorporating NBTI effects into SPICE simulations [5]. The method includes 802 specifying a netlist for an IC 804, simulating the IC with the netlist 806, calculating NBTI degradation and recovery effects 808, determining an aged netlist [6] [7] (based on the combined NBT degradation results) 810, and simulating the IC with the aged netlist 812. That is, the netlist is modified to incorporate the results of the NBTI analysis.

Figure 9A:
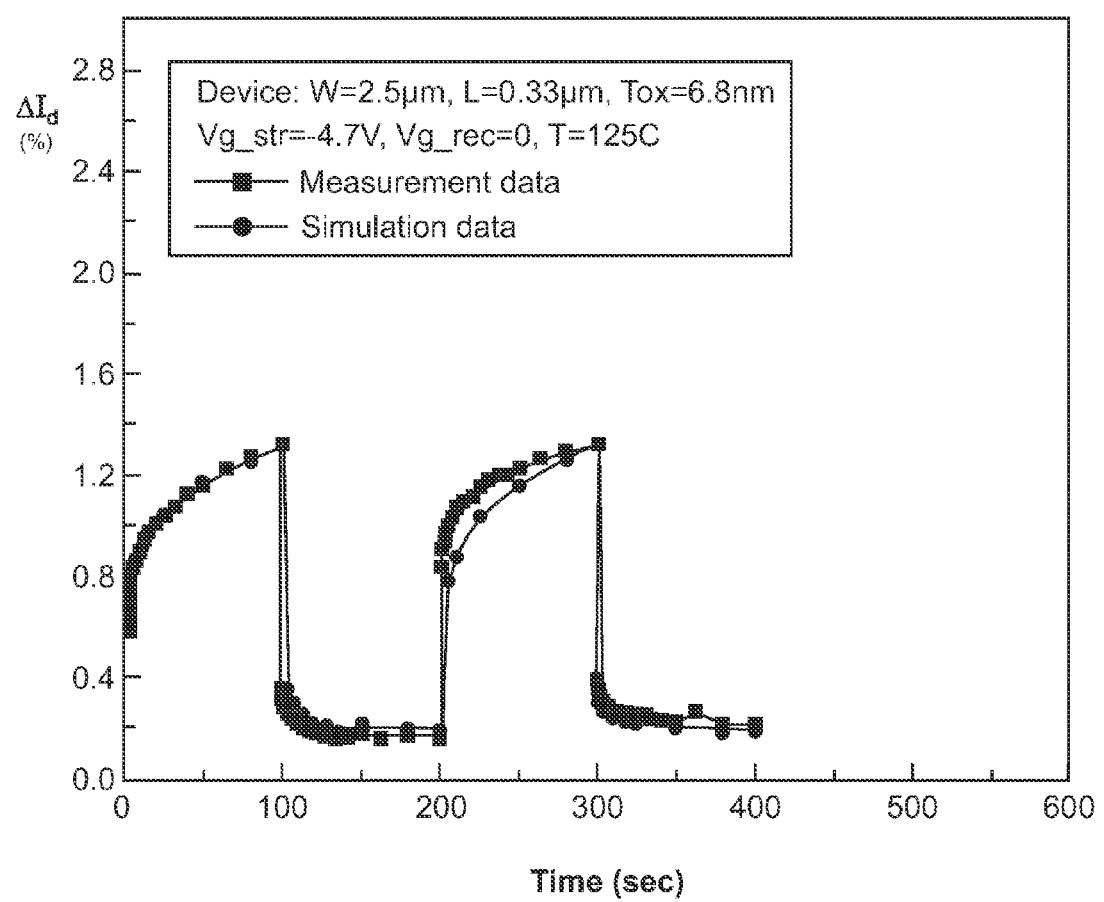
FIGS. 9A, 9B, 9C, and 9D show exemplary NBTI simulations compared with measured data for a circuit.
Figure 9B:
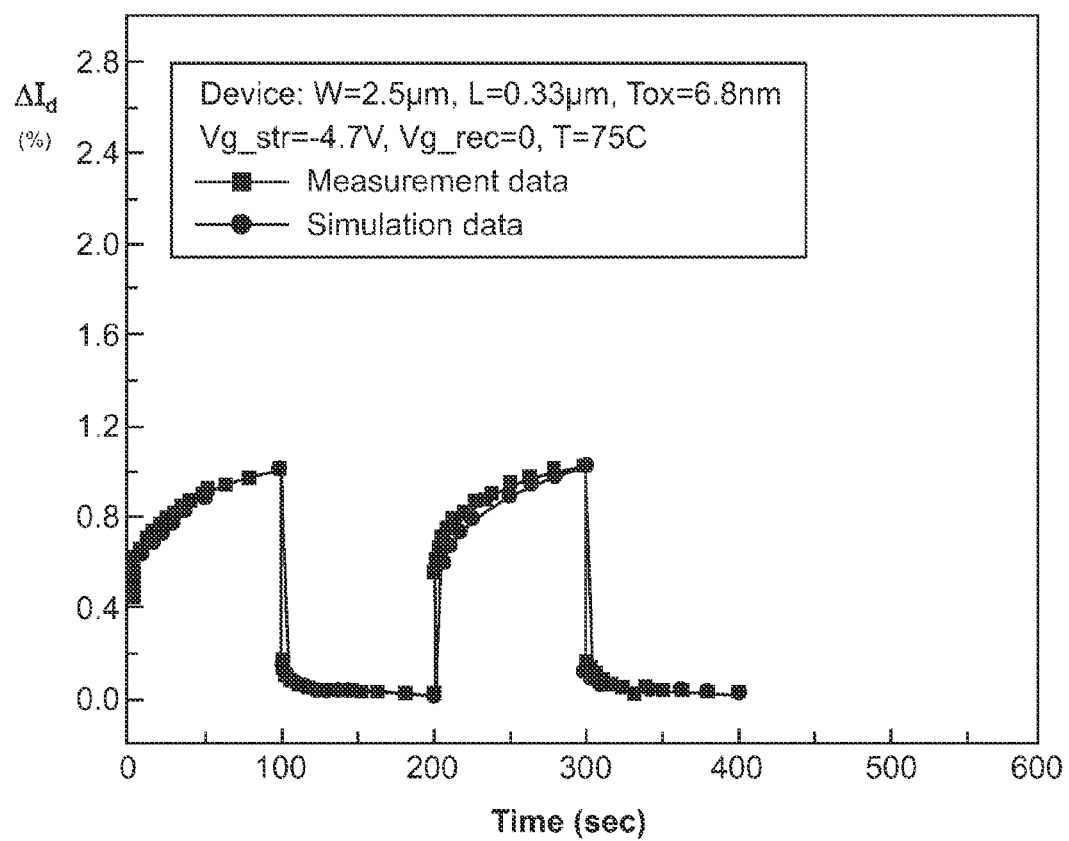
Figure 9C:
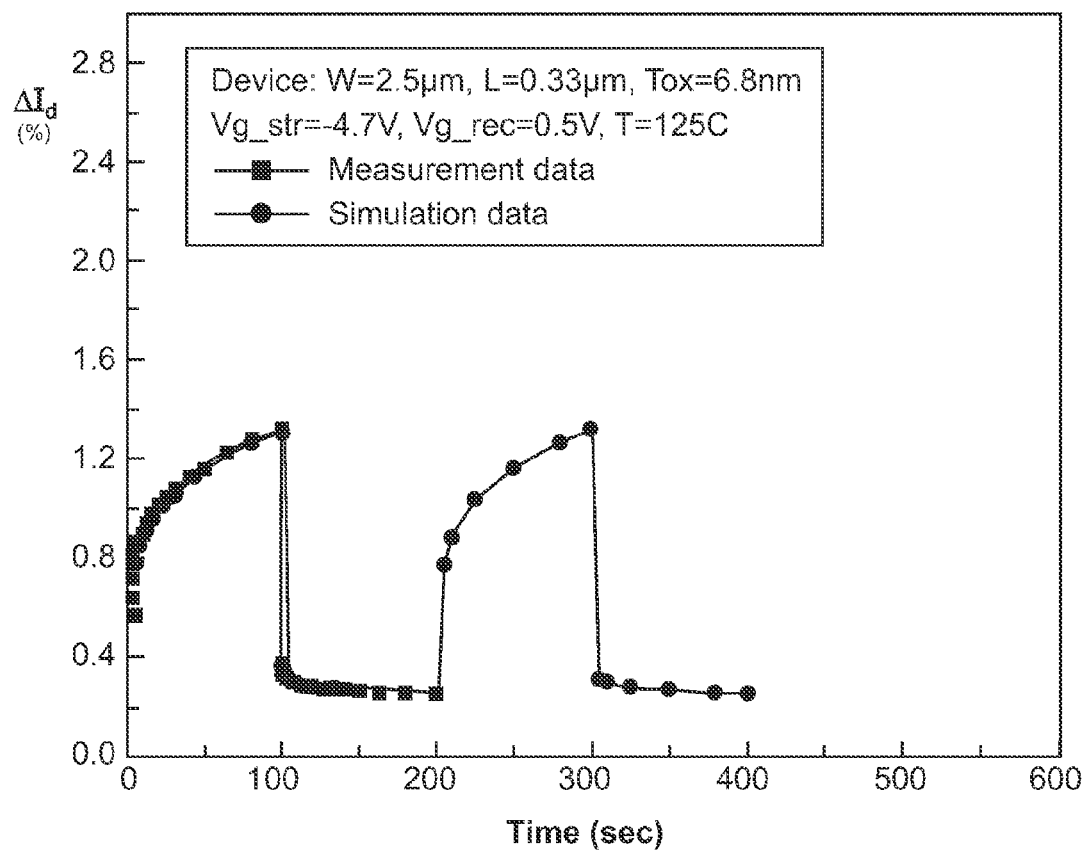
Figure 9D:
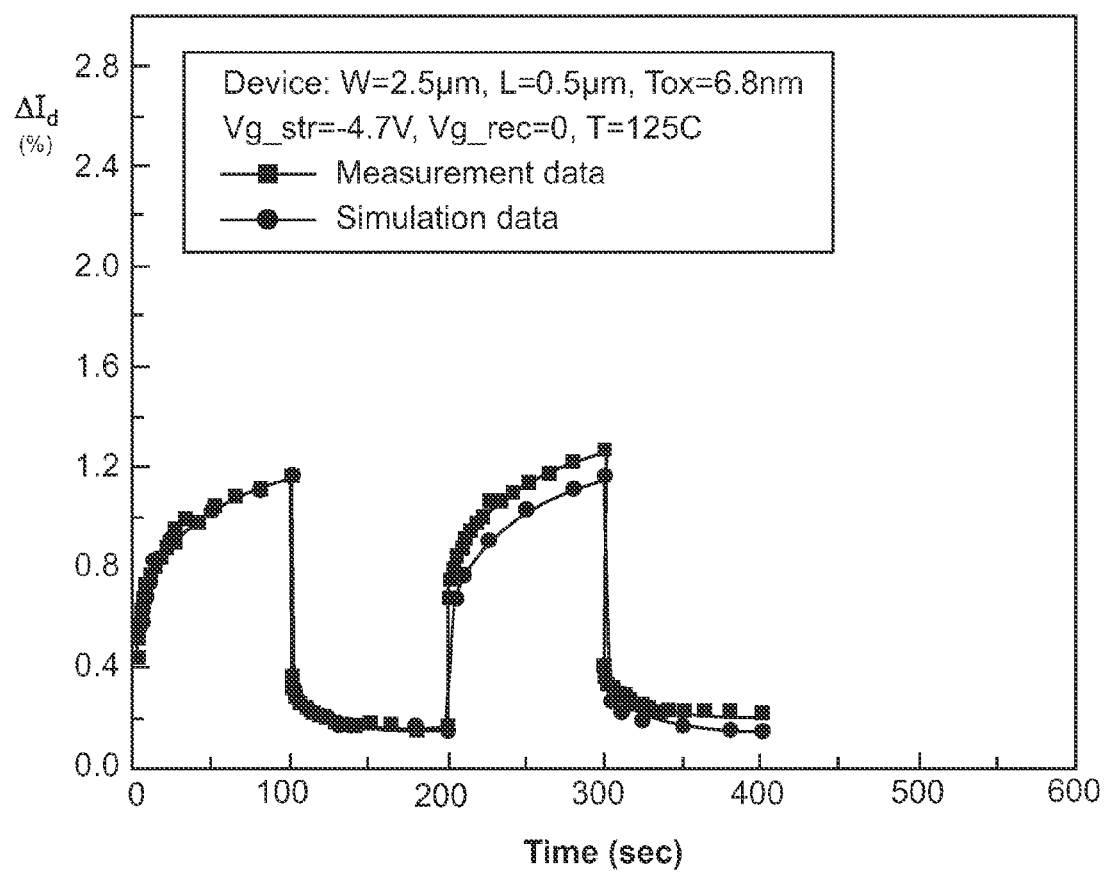

FIGS. 9A-9D show comparisons between simulated and measured results for NBTI effects. FIG. 9A shows channel length L=0.33 µm, under recovery voltage of 0 V at 125° C. FIG. 9B shows channel length L=0.33 µm, under recovery voltage of 0 V at 75° C. FIG. 9C shows channel length L=0.33 µm, under recovery voltage of –0.5 V at 125° C. FIG. 9D shows channel length L=0.5 µm, under recovery voltage of 0 V at 125° C.

4. Specifying NBTI Parameters

As discussed above, parameters for the degradation and recovery models (Eqs. (1)-(2)) can be specified 104, 106 based on given parametric ranges or by fitting data that has been collected by monitoring circuit behavior over a number of aging events. Some specific embodiments related to the parametric forms described above are presented herein for illustrative purposes.

Figure 10A:
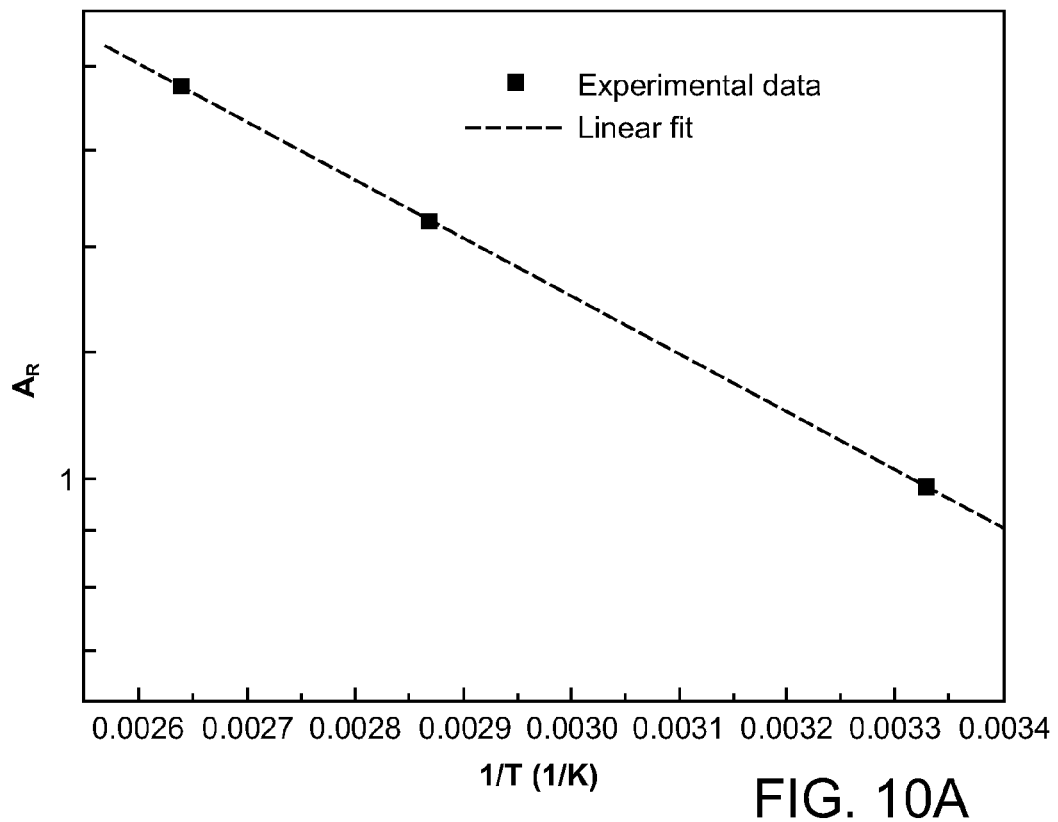
FIGS. 10A, 10B, 10C, and 10D show relationships used for the determination of various parameters for the embodiment shown in FIG. 1.
Figure 10B:
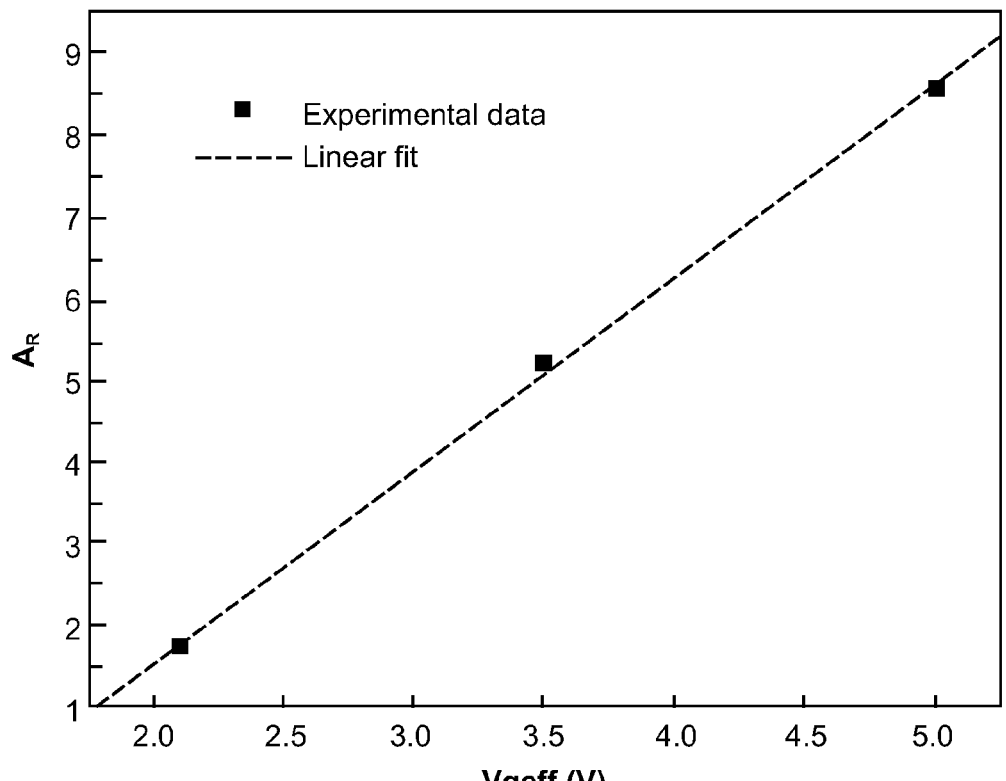
Figure 10C:
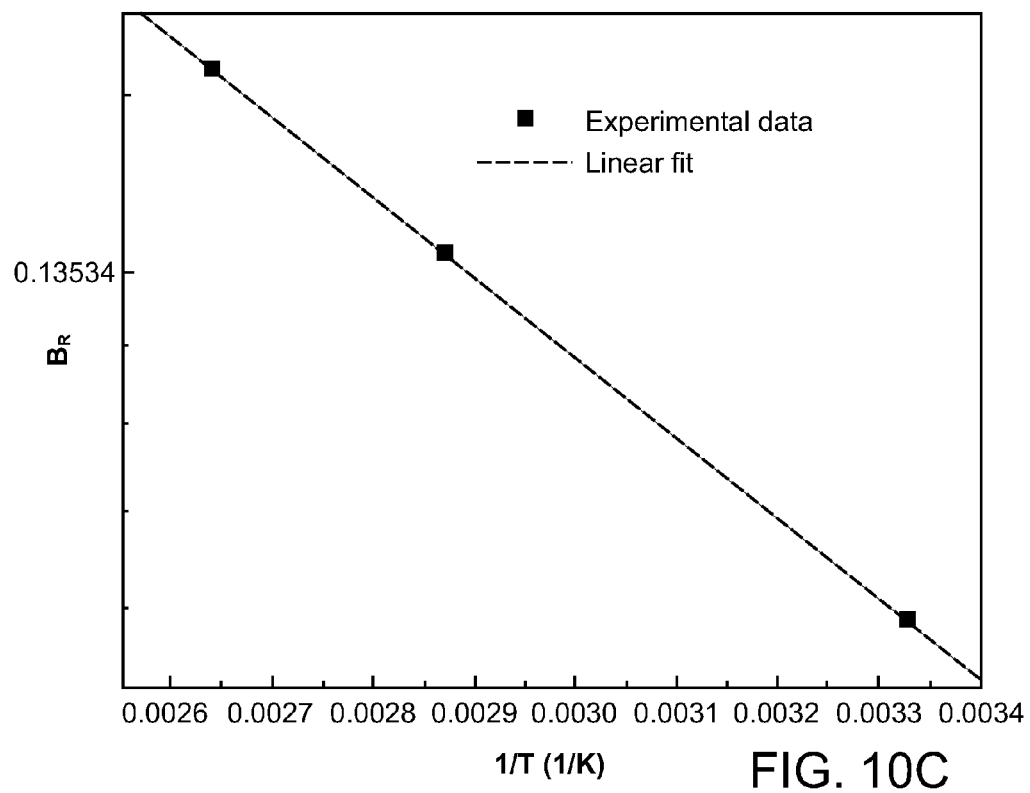
Figure 10D:
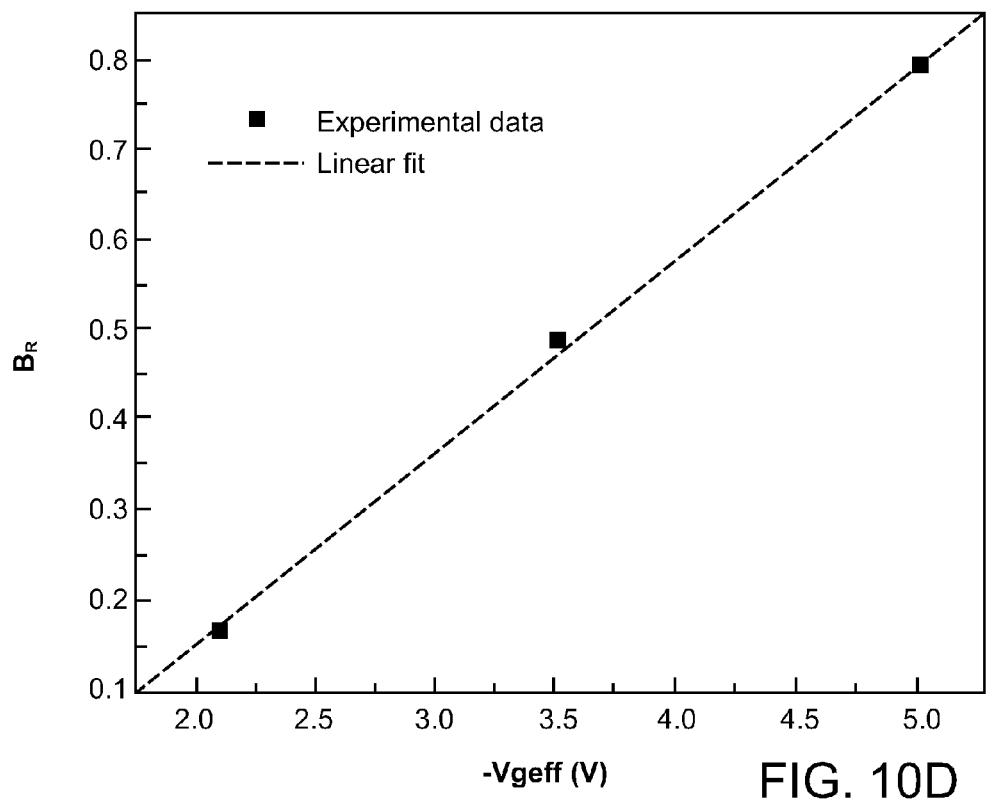

FIGS. 10A-10D show plots related to the extraction of parameters related to $A_R$ in Eq. (3) and $B_R$ in Eq. (4). FIG. 10A shows $\ln A_R$ vs. $1/T$. FIG. 10B shows $A_R$ vs. $-V_{geff}$. FIG. 10C shows $\ln B_R$ vs. $1/T$. FIG. 10D shows $B_R$ vs. $-V_{geff}$.

For $A_R$ in Eq. (3) the related parameters can be identified in stages. First, as illustrated in FIG. 10A, $E_{aA}$ can be obtained from the Arrhenius plot: $\ln A_R \sim 1/T$. Next, as illustrated in FIG. 10B, $A_{Ag}$ and $B_{Ag}$ can be obtained from the plot: $A_R \sim V_{geff}$. Then, after the parameters: $E_{aA}, A_{Ag}$, and $B_{Ag}$ are identified, the parameter $A_l$ can be calculated for each channel length:

$$A_l(L)=A_R(L)/(\exp(qE_{aA}/(kT))*A_{Ag}+B_{Ag}V_{geff})) \quad (8)$$

For BR in Eq. (4), the related parameters can be identified in stages. First, as illustrated in FIG. 10C, $E_{aB}$ can be obtained from the Arrhenius plot: $\ln B_R \sim 1/T$. Next, as illustrated in FIG. 10D, $A_{Bg}$ and $B_{Bg}$ can be obtained from the plot: $B_R \sim V_{geff}$. Then, after the parameters $E_{aB}, A_{Bg}, B_{Bg}$, are identified, the parameter $B_l$ can be calculated for each channel length:

$$B_l(L)=B_R(L)/(\exp(qE_{aB}/(kT))*(A_{Bg}+B_{Bg}V_{geff})) \quad (9)$$

The parameter $n\_Vgeff$ in Eq. (6) can be identified by an averaging approach. That is, after degradation at Vds=0V, select multiple $V_{ds}$ values that are greater than $V_{ds\_th}$ for recovery measurements. Then get corresponding ΔR values from Eq. (2) and get corresponding n_Vgeff values. The final n_Vgeff value is the mean value of these values. In some operational settings averaging just a few values may be sufficient for this approach.

5. Additional Embodiments

Additional embodiments relate to an apparatus for carrying out any one of the above-described methods, where the apparatus includes a computer for executing computer instructions related to the method. In this context the computer may be a general-purpose computer including, for example, a processor, memory, storage, and input/output devices (e.g., monitor, keyboard, disk drive, Internet connection, etc.). However, the computer may include circuitry or other specialized hardware for carrying out some or all aspects of the method. In some operational settings, the apparatus may be configured as a system that includes one or more units, each of which is configured to carry out some aspects of the method either in software, in hardware or in some combination thereof.

At least some values based on the results of the method can be saved, either in memory (e.g., RAM (Random Access Memory)) or permanent storage (e.g., a hard-disk system) for later use.

Additional embodiments also relate to a computer-readable medium that stores (e.g., tangibly embodies) a computer program for carrying out any one of the above-described methods by means of a computer. The computer program may be written, for example, in a general-purpose programming language (e.g., C, C++) or some specialized application-specific language. The computer program may be stored as an encoded file in some useful format (e.g., binary, ASCII).

Although only certain exemplary embodiments of this invention have been described in detail above, those skilled in the art will readily appreciate that many modifications are possible in the exemplary embodiments without materially departing from the novel teachings and advantages of this invention. For example, aspects of embodiments disclosed above can be combined in other combinations to form additional embodiments. Accordingly, all such modifications are intended to be included within the scope of this invention.

6. References

The following references are related to the disclosed subject matter:

[1] H. Usui, M. Kanno, and T. Morikawa, "Time and Voltage Dependence of Degradation and Recovery under Pulsed Negative Bias Temperature Stress," IRPS 2003.
[2] S. Rangan, N. Mielke, and E. C. C Yeh, "Universal Recovery Behavior of Negative Bias Temperature Instability," pp. 341-344, IEDM 2003.
[3] B. Zhu, J. S. Suchle, and J. B. Bernstein, "Mechanism for Reduced NBTI Effect under Pulsed Bias Stress Conditions," IRPS 2004.
[4] W. Abadeer and W. Ellis, "Behavior of NBTI under AC Dynamic Circuit Conditions," pp. 17-22, IRPS 2003.

[5] K. S. Kundert, *The Designer's Guide to SPICE and SPECTRE®*, Kluwer Academic Publishers. 1995.

[6] Z. Liu, W. Zhang, and F. Mu, "Build-in reliability analysis for circuit design in the nanometer technology era," ICICDT '04 (International Conference on Integrated Circuit Design and Technology, 2004).

[7] U.S. Pat. No. 6,278,964 B1, "Hot carrier effect simulation for integrated circuits," Aug. 21, 2001.

What is claimed is:

1. A computer-implemented method of determining a Negative Bias Temperature Instability (NBTI) effect that combines degradation and recovery for dynamic operation of an integrated circuit (IC), comprising:
    specifying one or more parameters for a degradation model for the IC during a stressed portion of a voltage cycle;
    specifying one or more parameters for a recovery model for the IC during an unstressed portion of the voltage cycle by extracting the one or more recovery-model parameters from measurements for the IC under unstressed conditions for a range of voltage bias values, a range of temperature values, and a range of IC geometric values;
    determining, by using a computer, a degradation value for the voltage cycle from the degradation model;
    determining, by using the computer, a recovery value for the voltage cycle from the recovery model that includes the extracted one or more recovery-model parameters by evaluating the recovery model at an operational setting that includes a first voltage bias value, a first temperature value and a first IC geometric value;
    determining an NTBI value that combines the degradation value and the recovery value for the voltage cycle; and
    saving the NBTI value in the computer's memory.

2. A method according to claim 1, wherein specifying the one or more degradation model parameters includes extracting the one or more degradation model parameters from measurements for the IC under stressed conditions for the range of voltage bias values, the range of temperature values, and the range of IC geometric values.

3. A method according to claim 2, wherein determining the degradation value for the voltage cycle includes evaluating the recovery model that includes the extracted one or more recovery-model parameters at the operational setting that includes the first voltage bias value, the first temperature value and the first IC geometric value.

4. A method according to claim 1, wherein determining the degradation value includes calculating the degradation value from a time value for the stressed portion of the voltage cycle at the operational setting that includes the first voltage bias value, the first temperature value and the first IC geometric value.

5. A method according to claim 1, wherein determining the recovery value includes calculating the recovery value from a time value for the unstressed portion of the voltage cycle at the operational setting that includes the first voltage bias value, the first temperature value and the first IC geometric value.

6. A method according to claim 1, wherein determining the NBTI value includes adding together the degradation value and the recovery value to calculate the NBTI effect for the voltage cycle at the operational setting that includes the first voltage bias value, the first temperature value and the first IC geometric value.

7. A method according to claim 1, wherein the NBTI value is a value for a variation in drain current for the IC for the voltage cycle at the operational setting that includes the first voltage bias value, the first temperature value and the first IC geometric value.

8. A method according to claim 1, wherein the stressed portion of the voltage cycle characterizes a voltage bias between two terminals of the IC.

9. A method according to claim 1, wherein the degradation value is a first degradation value, the recover value is a first recovery value, and the NBTI value is a first NBTI value, and the method further comprises:
    determining a plurality of degradation values from the degradation model at the operational setting that includes the first voltage bias value, the first temperature value and the first IC geometric value;
    determining a plurality of recovery values from the recovery model at the operational setting that includes the first voltage bias value, the first temperature value and the first IC geometric value; and
    determining a multi-cycle NBTI value by combining the degradation values and the recovery values over multiple voltage cycles.

10. A method according to claim 1, further comprising:
    specifying a netlist for the IC;
    aging the netlist based on the NBTI value; and
    simulating the aged netlist for calculating NBTI effects in the IC.

11. The method of claim 1, wherein
    the degradation model includes a linear function of a power of the stressed portion of the voltage cycle; and
    the recovery model includes a linear function of a logarithm of the unstressed portion of the voltage cycle.

12. The method of claim 1, wherein
    determining the degradation value includes evaluating a linear function of a power of the stressed portion of the voltage cycle, the degradation value being a variation in drain current for the IC in the stressed portion of the voltage cycle at the operational setting that includes the first voltage bias value, the first temperature value and the first IC geometric value, and
    determining the recovery value includes evaluating a linear function of a logarithm of the unstressed portion of the voltage cycle, the recovery value being a variation in drain current for the IC in the unstressed portion of the voltage cycle at the operational setting that includes the first voltage bias value, the first temperature value and the first IC geometric value.

13. An apparatus for determining a Negative Bias Temperature Instability (NBTI) effect that combines degradation and recovery for dynamic operation of an integrated circuit (IC), the apparatus comprising a computer for executing computer instructions, wherein the computer includes computer instructions for:
    setting one or more parameters for a degradation model for the IC during a stressed portion of a voltage cycle;
    setting one or more parameters for a recovery model for the IC during an unstressed portion of the voltage cycle by extracting the one or more recovery-model parameters from measurements for the IC under unstressed conditions for a range of voltage bias values, a range of temperature values, and a range of IC geometric values;
    determining a degradation value for the voltage cycle from the degradation model;
    determining a recovery value for the voltage cycle from the recovery model that includes the extracted one or more recovery-model parameters by evaluating the recovery model at an operational setting that includes a first voltage bias value, a first temperature value and a first IC geometric value;
    determining an NBTI value that combines the degradation value and the recovery value for the voltage cycle; and saving the NBTI value in the computer's memory.

14. An apparatus according to claim 13, wherein the computer includes a processor with memory for executing at least some of the computer instructions.

15. An apparatus according to claim 13, wherein the computer includes circuitry for executing at least some of the computer instructions.

16. An apparatus according to claim 13, wherein determining the degradation value includes calculating the degradation value from a time value for the stressed portion of the voltage cycle at the operational setting that includes the first voltage bias value, the first temperature value and the first IC geometric value.

17. An apparatus according to claim 13, wherein determining the recovery value includes calculating the recovery value from a time value for the unstressed portion of the voltage cycle at the operational setting that includes the first voltage bias value, the first temperature value and the first IC geometric value.

18. An apparatus according to claim 13, wherein the computer further includes computer instructions for:
   specifying a netlist for the IC;
   aging the netlist based on the NBTI value; and
   simulating the aged netlist for calculating NBTI effects in the IC.

19. A non-transitory computer-readable medium that stores a computer program that when executed on a computer performs operations for determining a Negative Bias Temperature Instability (NBTI) effect that combines degradation and recovery for dynamic operation of an integrated circuit (IC), wherein the computer program includes instructions for:
   setting one or more parameters for a degradation model for the IC during a stressed portion of a voltage cycle;
   setting one or more parameters for a recovery model for the IC during an unstressed portion of the voltage cycle by extracting the one or more recovery-model parameters from measurements for the IC under unstressed conditions for a range of voltage bias values, a range of temperature values, and a range of IC geometric values;
   determining a degradation value for the voltage cycle from the degradation model;
   determining a recovery value for the voltage cycle from the recovery model that includes the extracted one or more recovery-model parameters by evaluating the recovery model at an operational setting that includes a first voltage bias value, a first temperature value and a first IC geometric value;
   determining an NBTI value that combines the degradation value and the recovery value for the voltage cycle; and
   saving the NBTI value in the computer's memory.

20. A computer-readable medium according to claim 19, wherein determining the degradation value includes calculating the degradation value from a time value for the stressed portion of the voltage cycle at the operational setting that includes the first voltage bias value, the first temperature value and the first IC geometric value.

21. A computer-readable medium according to claim 19, wherein determining the recovery value includes calculating the recovery value from a time value for the unstressed portion of the voltage cycle at the operational setting that includes the first voltage bias value, the first temperature value and the first IC geometric value.

22. A computer-readable medium according to claim 19, wherein the computer program further includes instructions for:
   specifying a netlist for the IC;
   aging the netlist based on the NBTI value; and
   simulating the aged netlist for calculating NBTI effects in the IC.

* * * * *

UNITED STATES PATENT AND TRADEMARK OFFICE
CERTIFICATE OF CORRECTION

| | | |
|---|---|---|
| PATENT NO. | : 8,290,759 B1 | Page 1 of 2 |
| APPLICATION NO. | : 12/061531 | |
| DATED | : October 16, 2012 | |
| INVENTOR(S) | : Mu et al. | |

It is certified that error appears in the above-identified patent and that said Letters Patent is hereby corrected as shown below:

On the Title page, in column 2, under "Other Publications", line 4, delete "E. C.C Yeh" and insert --E. C. C. Yeh--, therefor On the Title page, in column 2, under "Other Publications", line 11, before "The", insert --"--, therefor On the Title page, in column 2, under "Other Publications", line 11, after "SPECTRE®", insert --"--, therefor On the Title page, in column 2, under "Other Publications", line 12, delete "Publishers." and insert --Publishers,--, therefor In the drawings, Sheet 2 of 16, Fig. 2, reference numeral 212, line 1, delete "Vgs" and insert --$V_{gs}$--, therefor On Sheet 2 of 16, Fig. 2, reference numeral 214, line 1, delete "Vds" and insert --$V_{ds}$--, therefor On Sheet 3 of 16, Fig. 3, line 1, delete "-Vgs" and insert -- -$V_{gs}$--, therefor On Sheet 15 of 16, Fig. 10B, line 1, delete "-Vgeff" and insert -- -$V_{geff}$--, therefor On Sheet 16 of 16, Fig. 10D, line 1, delete "-Vgeff" and insert -- -$V_{geff}$--, therefor In column 2, line 42, after "IC", insert --.--, therefor In column 3, line 36, delete "Vgs" and insert --$V_{gs}$--, therefor In column 3, line 58, delete "Vgs" and insert --$V_{gs}$--, therefor Signed and Sealed this
Twenty-sixth Day of February, 2013

Teresa Stanek Rea
*Acting Director of the United States Patent and Trademark Office*

CERTIFICATE OF CORRECTION (continued)
U.S. Pat. No. 8,290,759 B1

In column 3, line 59, delete "Vgs" and insert --$V_{gs}$--, therefor

In column 3, line 59, delete "Vgs" and insert --$V_{gs}$--, therefor

In column 3, line 59, delete "Vds" and insert --$V_{ds}$--, therefor

In column 3, line 60, delete "Vbs" and insert --$V_{ds}$--, therefor

In column 3, line 64, delete "(Id)" and insert --$(I_d)$--, therefor

In column 4, line 3, delete "Vgs" and insert --$V_{gs}$--, therefor

In column 5, line 23, delete "101" and insert --102--, therefor

In column 5, line 64, delete "BR" and insert --$B_R$--, therefor

In column 6, line 6, delete "n_$V_{geff}$" and insert --n_$V_{geff}$--, therefor In column 6, line 7, delete "Vds" and insert --$V_{ds}$--, therefor In column 6, line 10, delete "n_Vgeff" and insert --n_$V_{geff}$--, therefor In column 6, line 11, delete "n_Vgeff" and insert --n_$V_{geff}$--, therefor In column 6, line 60, delete "E. C. C Yeh" and insert --E. C. C. Yeh--, therefor In column 6, line 63, delete "Suchle" and insert --Suehle--, therefor In column 7, line 30, in Claim 1, delete "NTBI" and insert --NBTI--, therefor